United States Patent
Yi et al.

(10) Patent No.: US 12,414,294 B2
(45) Date of Patent: Sep. 9, 2025

(54) MEMORY DEVICE

(71) Applicant: UNITED MICROELECTRONICS CORP., Hsin-Chu (TW)

(72) Inventors: Liang Yi, Singapore (SG); Chi Ren, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 480 days.

(21) Appl. No.: 17/952,322

(22) Filed: Sep. 26, 2022

(65) Prior Publication Data

US 2024/0074174 A1 Feb. 29, 2024

(30) Foreign Application Priority Data

Aug. 29, 2022 (TW) .................... 111132446

(51) Int. Cl.
*H10B 41/30* (2023.01)
*H10B 41/10* (2023.01)
*H10B 41/46* (2023.01)

(52) U.S. Cl.
CPC ............. *H10B 41/30* (2023.02); *H10B 41/10* (2023.02); *H10B 41/46* (2023.02)

(58) Field of Classification Search
CPC ........ H10B 41/30; H10B 41/10; H10B 41/46; H10D 30/6892; H10D 64/035
See application file for complete search history.

(56) References Cited

U.S. PATENT DOCUMENTS

| | | | | |
|---|---|---|---|---|
| 6,894,339 B2 * | 5/2005 | Fan | ..................... | G11C 16/0433 257/314 |
| 8,928,060 B2 | 1/2015 | Tsair | | |
| 9,159,735 B2 | 10/2015 | Tsair | | |
| 10,868,197 B1 * | 12/2020 | Yi | ......................... | H10B 41/35 |
| 12,040,369 B2 * | 7/2024 | Yi | ........................ | H10D 64/035 |

* cited by examiner

*Primary Examiner* — Allison Bernstein (74) *Attorney, Agent, or Firm* — Winston Hsu (57) ABSTRACT

A memory device includes a semiconductor substrate, isolation structures, an erase gate, and floating gates. The isolation structures are disposed in the semiconductor substrate. Active regions separated from one another are defined in the semiconductor substrate by the isolation structures, and each of the active regions is elongated in a first direction. The erase gate is disposed on the semiconductor substrate and elongated in a second direction. The erase gate is disposed on the active regions and the isolation structures, and the erase gate is partly disposed in a recess within each of the isolation structures. The floating gates are disposed on the semiconductor substrate. The floating gates are arranged in the second direction and separated from one another, and each of the floating gates is partly disposed under the erase gate in a vertical direction.

20 Claims, 8 Drawing Sheets

MEMORY DEVICE

BACKGROUND OF THE INVENTION

1. Field of the Invention

The present invention relates to a memory device, and more particularly, to a memory device including an erase gate.

2. Description of the Prior Art

Semiconductor memory devices are used in computer and electronics industries as a means for retaining digital information or data. Typically, the semiconductor memory devices are divided into volatile and non-volatile memory devices. The non-volatile memory devices, which can retain their data even when the power supply is interrupted, have been widely employed. As one kind of the non-volatile memory technology, a SONOS memory structure is to build a silicon nitride layer sandwiched between two silicon oxide layers for serving as the charge trapping layer while the two silicon oxide layers respectively serve as a charge tunnel layer and a charge block layer. This oxide-nitride-oxide (ONO) multilayered structure which is used as a main unit for information storage is disposed on a semiconductor substrate, a silicon floating gate may be disposed on the ONO multilayered structure, and thus a SONOS memory structure is constructed. Since the microprocessors have become more powerful, requirement to memory devices of large-capacity and low-cost is raised. To satisfy such trend and achieve challenge of high integration in semiconductor devices, memory miniaturization is kept on going, and thus fabrication process of memory structure is getting complicated. Therefore, it is always a target for the related industries to effectively enhance integrity and density of the memory cells by modifying the designs.

SUMMARY OF THE INVENTION

A memory device is provided in the present invention. An erase gate is partly disposed in a recess within an isolation structure for reducing a dimension of a memory cell and/or an area occupied by the memory device.

According to an embodiment of the present invention, a memory device is provided. The memory device includes a semiconductor substrate, a plurality of isolation structures, an erase gate, and a plurality of floating gates. The isolation structures are disposed in the semiconductor substrate. A plurality of active regions separated from one another are defined in the semiconductor substrate by the isolation structures, and each of the active regions is elongated in a first direction. The erase gate is disposed on the semiconductor substrate and elongated in a second direction. The erase gate is disposed on the active regions and the isolation structures, and the erase gate is partly disposed in a recess within each of the isolation structures. The floating gates are disposed on the semiconductor substrate. The floating gates are arranged in the second direction and separated from one another, and each of the floating gates is partly disposed under the erase gate in a vertical direction.

According to another embodiment of the present invention, a memory device is provided. The memory device includes a semiconductor substrate, a plurality of isolation structures, an erase gate, a plurality of floating gates, a mask layer, and a dielectric layer. The isolation structures are disposed in the semiconductor substrate. A plurality of active regions separated from one another are defined in the semiconductor substrate by the isolation structures, and each of the active regions is elongated in a first direction. The erase gate is disposed on the semiconductor substrate and elongated in a second direction. The erase gate is disposed on the active regions and the isolation structures, and the erase gate is partly disposed in a recess within each of the isolation structures. The floating gates are disposed on the semiconductor substrate, and the floating gates are arranged in the second direction and separated from one another. The mask layer is disposed on the floating gates and elongated in the second direction. The dielectric layer is disposed between the mask layer and each of the floating gates in a vertical direction, and the dielectric layer is directly connected with the mask layer.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
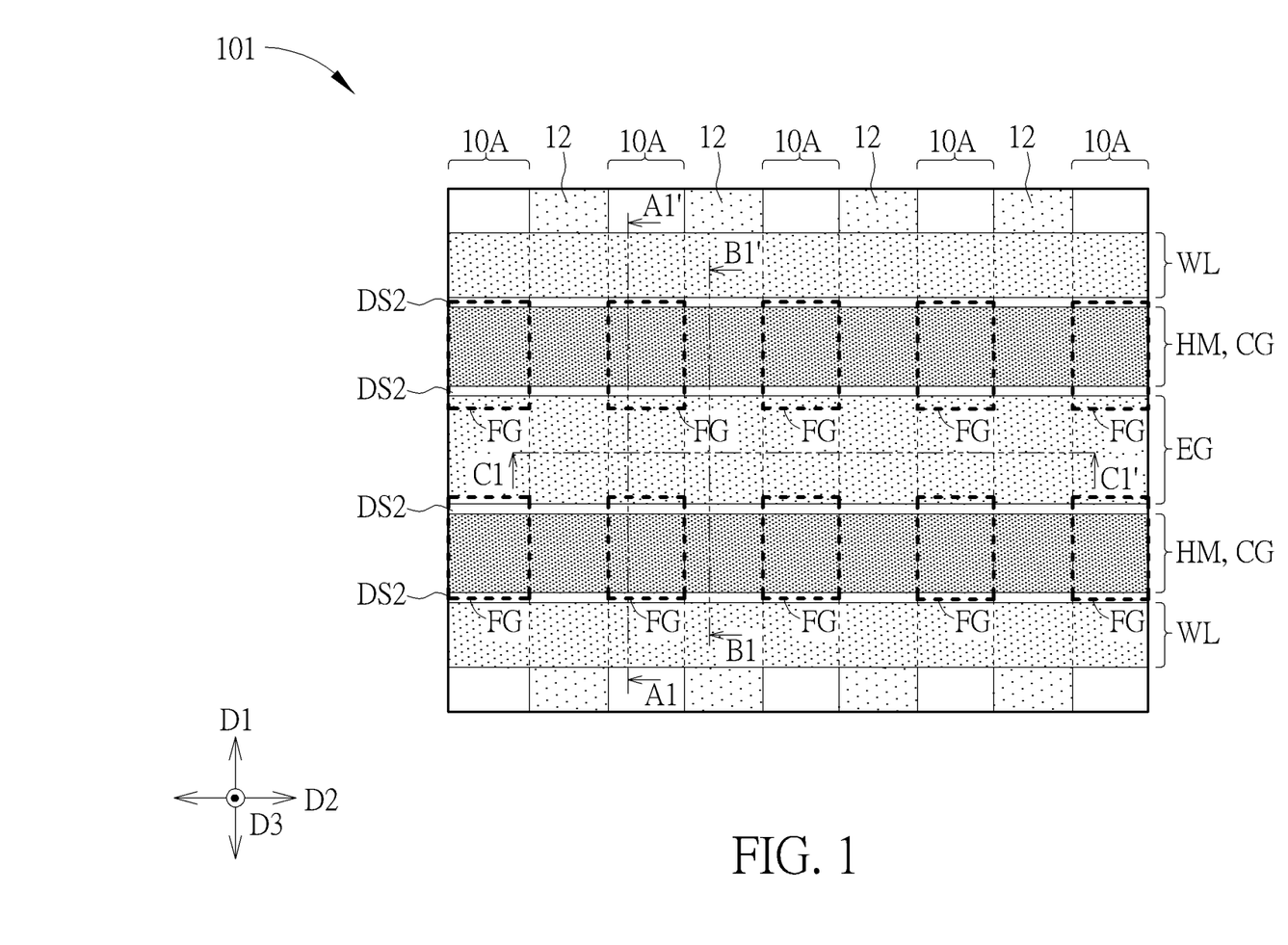
FIG. 1 is a schematic drawing illustrating a memory device according to a first embodiment of the present invention.
Figure 2:
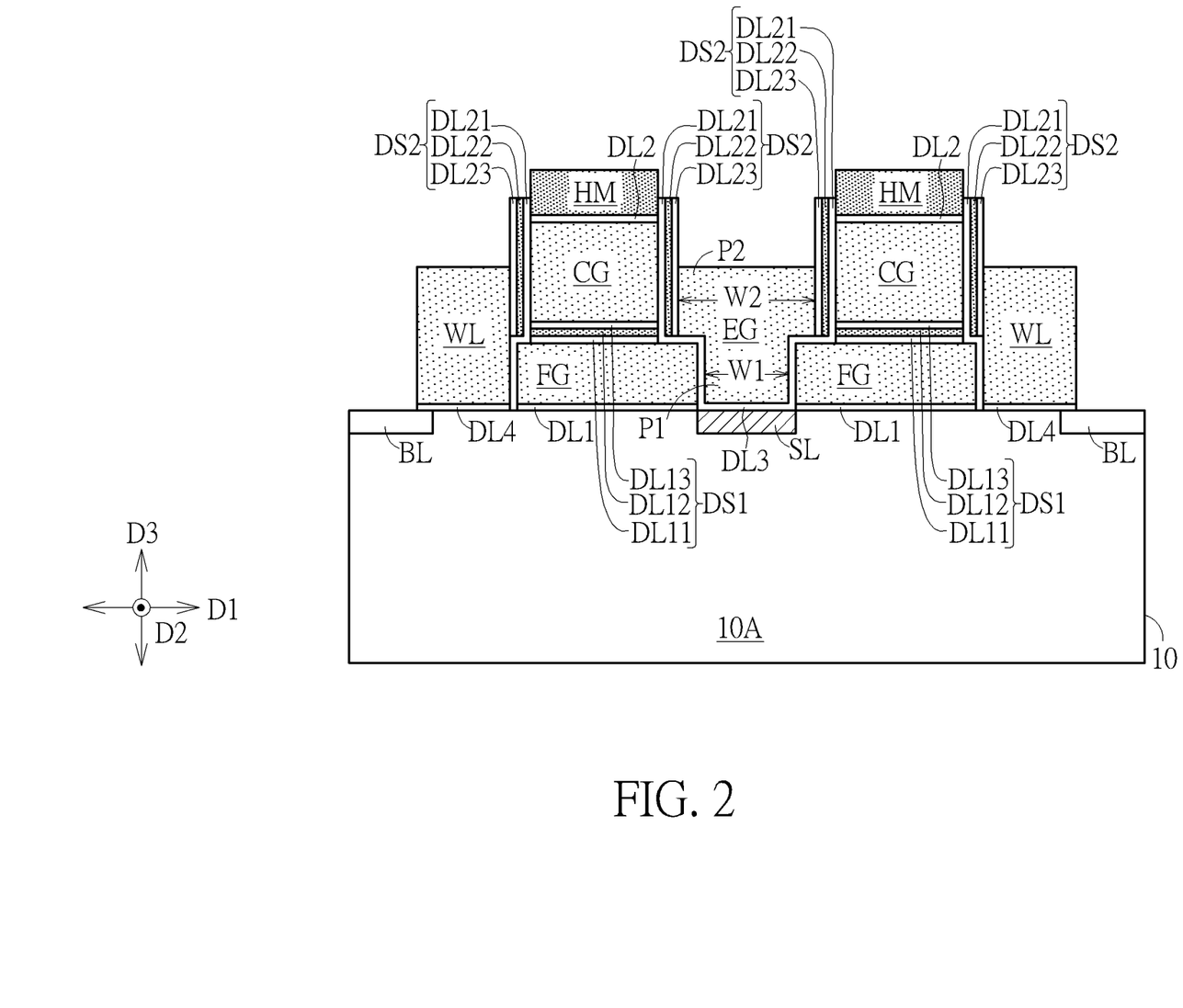
FIG. 2 is a cross-sectional diagram taken along a line A1-A1' in FIG. 1.
Figure 3:
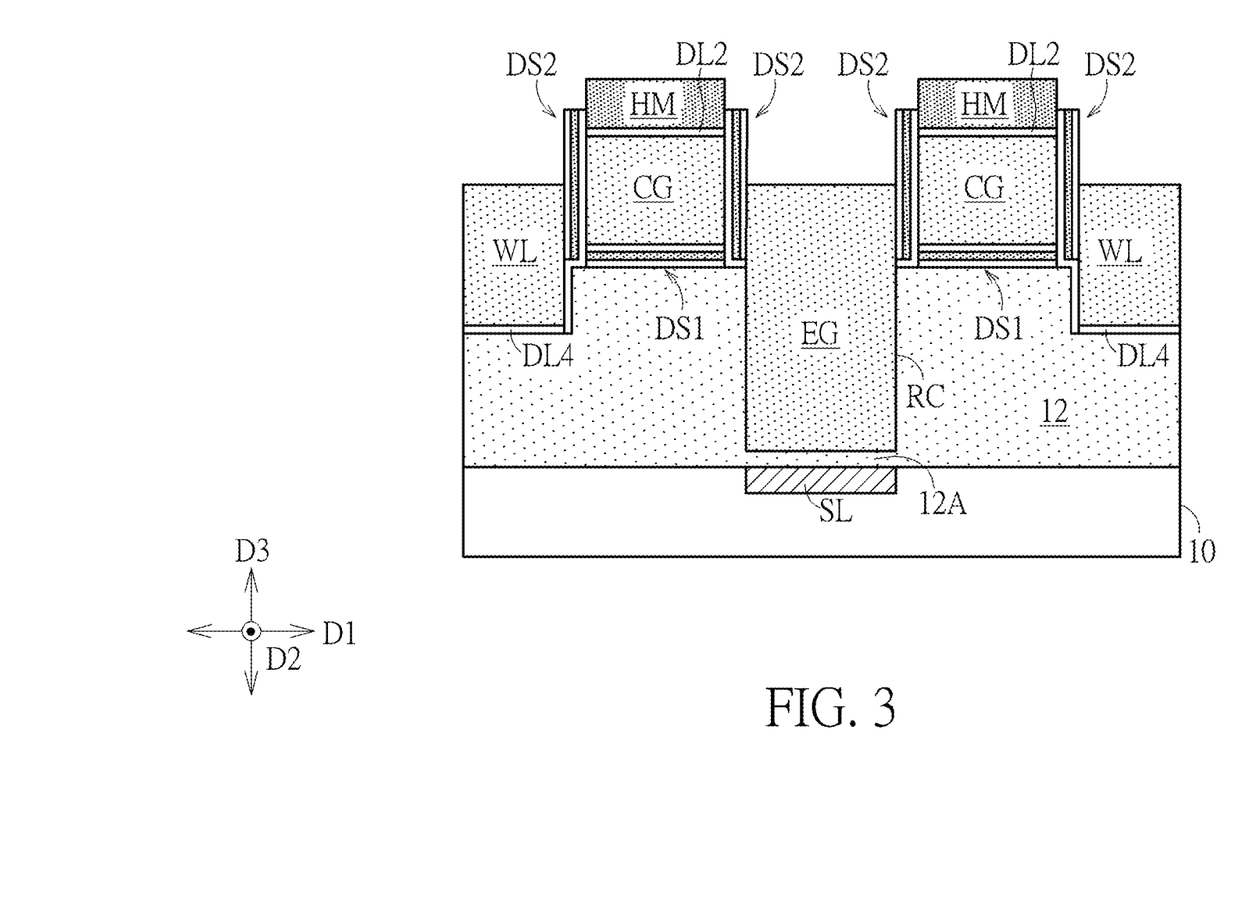
FIG. 3 is a cross-sectional diagram taken along a line B1-B1' in FIG. 1.
Figure 4:
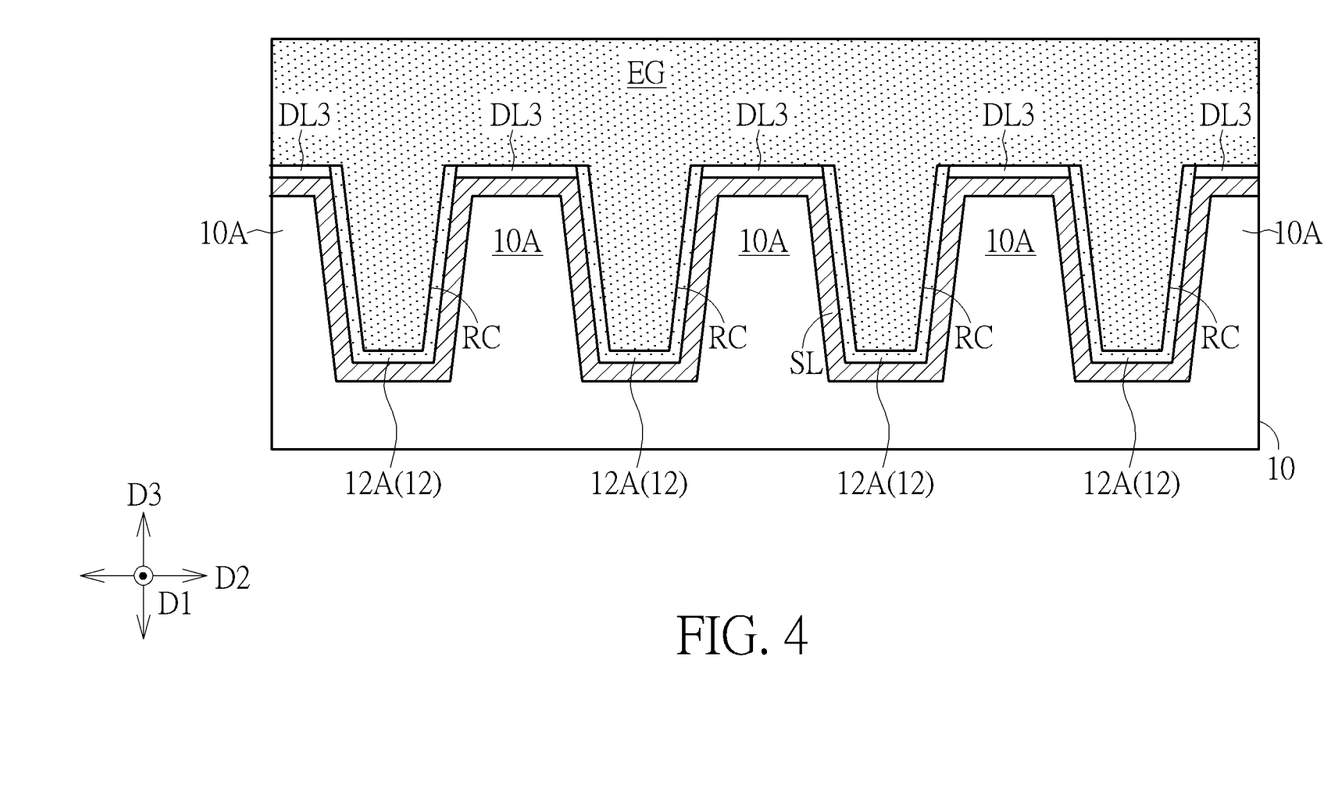
FIG. 4 is a cross-sectional diagram taken along a line C1-C1' in FIG. 1.

Please refer to FIGS. 1-4. FIG. 1 is a schematic drawing illustrating a memory device 101 according to a first embodiment of the present invention. FIG. 2 is a cross-sectional diagram taken along a line A1-A1' in FIG. 1, FIG. 3 is a cross-sectional diagram taken along a line B1-B1' in FIG. 1, and FIG. 4 is a cross-sectional diagram taken along a line C1-C1' in FIG. 1. As shown in FIGS. 1-4, the memory device 101 includes a semiconductor substrate 10, a plurality of isolation structures 12, an erase gate EG, and a plurality of floating gates FG. The isolation structures 12 are disposed in the semiconductor substrate 10. Active regions 10A separated from one another are defined in the semiconductor substrate 10 by the isolation structures 12, and each of the active regions 10A is elongated in a first direction (such as a direction D1 illustrated in FIGS. 1-4). The erase gate EG is disposed on the semiconductor substrate 10 and elongated in a second direction (such as a direction D2 illustrated in FIGS. 1-4). The erase gate EG is disposed on the active regions 10A and the isolation structures 12, and the erase gate EG is partly disposed in a recess RC within each of the isolation structures 12. The floating gates FG are disposed on the semiconductor substrate 10. The floating gates FG are arranged in the direction D2 and separated from one another, and each of the floating gates FG is partly disposed under the erase gate EG in a vertical direction (such as a direction D3 illustrated in FIGS. 1-4).

In some embodiments, the vertical direction described above (such as the direction D3) may be regarded as a thickness direction of the semiconductor substrate 10, the semiconductor substrate 10 may have a top surface and a bottom surface opposite to the top surface in the direction D3, and the erase gate EG and the floating gates FG described above may by formed on a side of the top surface of the semiconductor substrate 10. Horizontal directions substantially orthogonal to the direction D3 (such as the direction D1, the direction D2, and other directions orthogonal to the direction D3) may be substantially parallel with the top surface and/or the bottom surface of the semiconductor substrate 10, but not limited thereto. In this description, a distance between the bottom surface of the semiconductor substrate 10 and a relatively higher location and/or a relatively higher part in the direction D3 may be greater than a distance between the bottom surface of the semiconductor substrate 10 and a relatively lower location and/or a relatively lower part in the direction D3. The bottom or a lower portion of each component may be closer to the bottom surface of the semiconductor substrate 10 in the direction D3 than the top or upper portion of this component. Another component disposed above a specific component may be regarded as being relatively far from the bottom surface of the semiconductor substrate 10 in the direction D3, and another component disposed under a specific component may be regarded as being relatively close to the bottom surface of the semiconductor substrate 10 in the direction D3.

Specifically, in some embodiments, the semiconductor substrate 10 may include a silicon substrate, an epitaxial silicon substrate, a silicon germanium substrate, a silicon carbide substrate, a silicon-on-insulator (SOI) substrate, or a semiconductor substrate formed with other suitable semiconductor materials and/or other suitable structures. The isolation structure 12 may include a single layer or multiple layers of insulation materials, such as an insulation liner layer and an insulation gap-filling material disposed on the insulation liner layer, but not limited thereto. In addition, the active regions 10A may be defined by the isolation structures 12 formed in the semiconductor substrate 10, the active regions 10A may be a part of the semiconductor substrate 10, and the material composition of the active region 10A may be identical to the material composition of the semiconductor substrate 10 accordingly. In some embodiments, in a top view diagram of the memory device 101 (such as FIG. 1), each of the active regions 10A and each of the isolation structures 12 may be elongated in the direction D1, the active regions 10A and the isolation structures 12 may be disposed and arranged alternately in the direction D2, and the direction D1 and the direction D2 may be orthogonal to each other substantially, but not limited thereto. Additionally, the floating gates FG may be made of polycrystalline silicon or other suitable electrically conductive materials, and the floating gates FG may be electrically floating without being directly connected to other electrically conductive materials. In some embodiments, the memory device 101 may further include a dielectric layer DL1 disposed between the semiconductor substrate 10 and each of the floating gates FG in the direction D3, and the dielectric layer DL1 may include an oxide dielectric material (such as silicon oxide) or other suitable dielectric materials.

In some embodiments, the memory device 101 may further include a source line region SL and a source dielectric layer (such as a dielectric layer DL3 illustrated in FIG. 2 and FIG. 4). The source line region SL may be disposed in the semiconductor substrate 10, the source line region SL may be disposed corresponding to the erase gate EG in the direction D3, and the dielectric layer DL3 may be disposed between the erase gate EG and the source line region SL. In some embodiments, the source line region SL may be a doped region, such as an n-type heavily doped region, formed in the semiconductor substrate 10, and the source line region SL may be elongated in the direction D2 in the top view diagram of the memory device 101, but not limited thereto. In addition, the material composition of the isolation structures 12 may be different from the material composition of the dielectric layer DL3. For example, the dielectric layer DL3 may include an oxide dielectric material (such as silicon oxide) or other suitable dielectric material, and the isolation structure 12 may be made of multiple layers of insulation materials, but not limited thereto.

As shown in FIGS. 1-4, recesses RC may be formed in the isolation structures 12, respectively. The thickness of a portion of each of the isolation structures 12 may be reduced by forming the recesses RC. For instance, the isolation structure 12 located under the erase gate EG in the direction D3 may be thinned, and the isolation structure 12 located at two opposite sides of the recess RC in the direction D2 may be thinned accordingly. The too thick isolation structure 12 that blocks the implantation process configured for forming the source line region SL to implant dopants into the semiconductor substrate 10 and the situation where the desired source line region SL cannot be formed accordingly may be avoided. In other words, the source line region SL may be formed along the lower edge of each of the isolation structures 12 and the lower edge of the dielectric layer DL3 by forming the recesses RC in the isolation structures 12, and the source line regions SL located between the erase gate EG and each of the active regions 10A in the direction D3 may be connected with one another in series. Therefore, the source line region SL may be partly disposed under each of the isolation structures 12 in the direction D3 and partly disposed under the dielectric layer DL3 in the direction D3, a portion 12A of each of the isolation structures 12 may be located between the erase gate EG and the source line region SL in the direction D3, and another portion of each of the isolation structures 12 may be located between the erase gate EG and the source line region SL in the direction D2. By the design described above, it is not necessary to define an active region extending in the direction D2 by the process of forming the isolation structures 12 in the semiconductor substrate 10, and the related process issues and/or design constraints derived in this way can be avoided. The width of the erase gate EG (may be regarded as the length in the direction D1) may be reduced relatively, and the purposes of reducing the dimension of the memory cell and/or the area occupied by the memory device may be achieved accordingly.

In some embodiments, the memory device 101 may further include a control gate CG, a word line structure WL, a bit line region BL, a dielectric stack DS1, a dielectric stack DS2, and a dielectric layer DL4. The bit line region BL may be disposed in the semiconductor substrate 10, and the control gate CG, the word line structure WL, the dielectric stack DS1, the dielectric stack DS2, and the dielectric layer DL4 may be disposed on the top surface of the semiconductor substrate 10. In some embodiments, the bit line region BL may be a doped region, such as an n-type heavily doped region, formed in the semiconductor substrate 10, and the bit line region BL may be elongated in the direction D2 in the top view diagram of the memory device 101, but not limited thereto. The control gate CG may be disposed on the floating gates FG and be elongated in the direction D2 in the top view diagram of the memory device 101. The length of the control gate CG in the direction D1 may be less than the length of each of the floating gates FG in the direction D1, and the control gate CG does not completely cover the corresponding floating gate FG in the direction D3 accordingly. A portion of each of the floating gates FG without overlapping the control gate CG in the direction D3 may be regarded as a protrusion edge extending towards the erase gate EG, this design may be beneficial for the erase operation generated by the erase gate EG and performed to the floating gates FG, and the erase speed of the memory device 101 may be improved accordingly. As shown in FIG. 1 and FIG. 2, in some embodiments, the erase gate EG may include a first portion P1 and a second portion P2 disposed above the first portion P1 in the direction D3, each of the floating gates FG may be partly disposed under the second portion P2 of the erase gate EG in the direction D3, and a width W2 of the second portion P2 may be greater than a width W1 of the first portion P1. In addition, the width W1 and the width W2 may also be regarded as the length of the first portion P1 in the direction D1 and the length of the second portion P2 in the direction D1, respectively, and a cross-section shape of a part of the erase gate EG may include a T-shaped structure including the first portion P1 and the second portion P2, but not limited thereto.

As shown in FIGS. 1-3, the word line structure WL is disposed on the semiconductor substrate 10 and elongated in the direction D2. A portion of each of the isolation structures 12, each of the floating gates FG, and a portion of the control gate CG may be sandwiched between the erase gate EG and the word line structure WL in the direction D1. The dielectric layer DL4 may be disposed between the word line structure WL and the semiconductor substrate 10 in the direction D3, and the dielectric layer DL4 may include an oxide dielectric material (such as silicon oxide) or other suitable dielectric materials. The dielectric stack DS1 may be partly disposed between the control gate CG and each of the floating gates FG in the direction D3 (as shown in FIG. 2) and partly disposed between the control gate CG and each of the isolation structures 12 in the direction D3 (as shown in FIG. 3), and the dielectric stack DS1 may be directly connected with the control gate CG, each of the floating gates FG, and each of the isolation structures 12. The dielectric stack DS2 may be disposed on a sidewall of the control gate CG. At least a portion of the dielectric stack DS2 may be disposed between the erase gate EG and the control gate CG in the direction D1, and this portion of the dielectric stack DS2 may be disposed above each of the floating gates FG in the direction D3.

In some embodiments, the control gate CG and the word line structure WL may be made of polycrystalline silicon or other suitable conductive materials, and the dielectric stack DS1 and the dielectric stack DS2 may be made of different dielectric material layers disposed in a stacked configuration. In some embodiments, the dielectric stack DS1 and the dielectric stack DS2 may include an oxide-nitride-oxide (ONO) dielectric stack, but not limited thereto. For example, the dielectric stack DS1 may include a dielectric layer DL11, a dielectric layer DL12, and a dielectric layer DL13 stacked on one another in the direction D3, the dielectric layer DL12 may be a nitride dielectric material (such as silicon nitride), and the dielectric layer DL11 and the dielectric layer DL13 may be an oxide dielectric material (such as silicon oxide), but not limited thereto. Similarly, the dielectric stack DS2 may include a dielectric layer DL21, a dielectric layer DL22, and a dielectric layer DL23 stacked on one another in the direction D1, the dielectric layer DL22 may be a nitride dielectric material (such as silicon nitride), and the dielectric layer DL21 and the dielectric layer DL23 may be an oxide dielectric material (such as silicon oxide), but not limited thereto.

In some embodiments, the memory device 101 may further include a mask layer HM and a dielectric layer DL2. The mask layer HM is disposed on the control gate CG and elongated in the direction D2 in the top view diagram of the memory device 101, and the dielectric layer DL2 is disposed between the mask layer HM and the control gate CG in the direction D3. The mask layer HM may include a nitride insulation material (such as silicon nitride) or other suitable insulation materials, and the dielectric layer DL2 may include an oxide dielectric material (such as silicon oxide) or other suitable dielectric materials. In some embodiments, the dielectric layer DL2 may be directly connected with the mask layer HM and the control gate CG, and the control gate CG may be encompassed by the dielectric layer DL2, the dielectric layer DL21, and the dielectric layer DL13 with the same material composition in the direction D3 and the direction D1, but not limited thereto. In some embodiments, the dielectric stack DS2 may further be partly disposed on the sidewall of the dielectric layer DL2 and the sidewall of the mask layer HM, the dielectric layer DL21 in the dielectric stack DS2 may further be partly disposed on the top surface and the sidewall of each of the floating gates FG, and the dielectric layer DL21 may be partly sandwiched between the floating gate FG and the erase gate EG in the direction D1 and partly sandwiched between the floating gate FG and the word line structure WL in the direction D1 accordingly, but not limited thereto.

In some embodiments, one of the floating gates FG and other component located corresponding to this floating gate FG, such as the corresponding control gate CG, the corresponding erase gate EG, the corresponding word line structure WL, the corresponding source line region SL, the corresponding bit line region BL, the corresponding dielectric stack DS1, and the corresponding dielectric stack DS2, may constitute a memory cell, but not limited thereto. In some embodiments, the memory device 101 may include two control gates CG, two mask layers HM, two word line structures WL, two bit line regions BL, two dielectric stacks DS1, and two dielectric stacks DS2 disposed at two opposite sides of the erase gate EG in the direction D1, respectively, the floating gates FG may be disposed at the two opposite sides of the erase gate EG in the direction D1, and the erase gate EG may be shared by two memory cells located adjacent to each other in the direction D1, but not limited thereto. By forming the recesses RC in the isolation structures 12, respectively, and disposing the erase gate EG partly in each of the recesses RC, the continuous source line region SL may be formed at the lower edge of each of the isolation structures 12 and the lower edge of the dielectric layer DL3 without forming the active region located under the erase gate EG and extending in the direction D2. Therefore, the width of the erase gate EG may be reduced relatively and the distance between the control gates CG of the memory cells located adjacent to each other in the direction D1 may be reduced relatively, and the purpose of reducing the area occupied by the memory device may be achieved.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
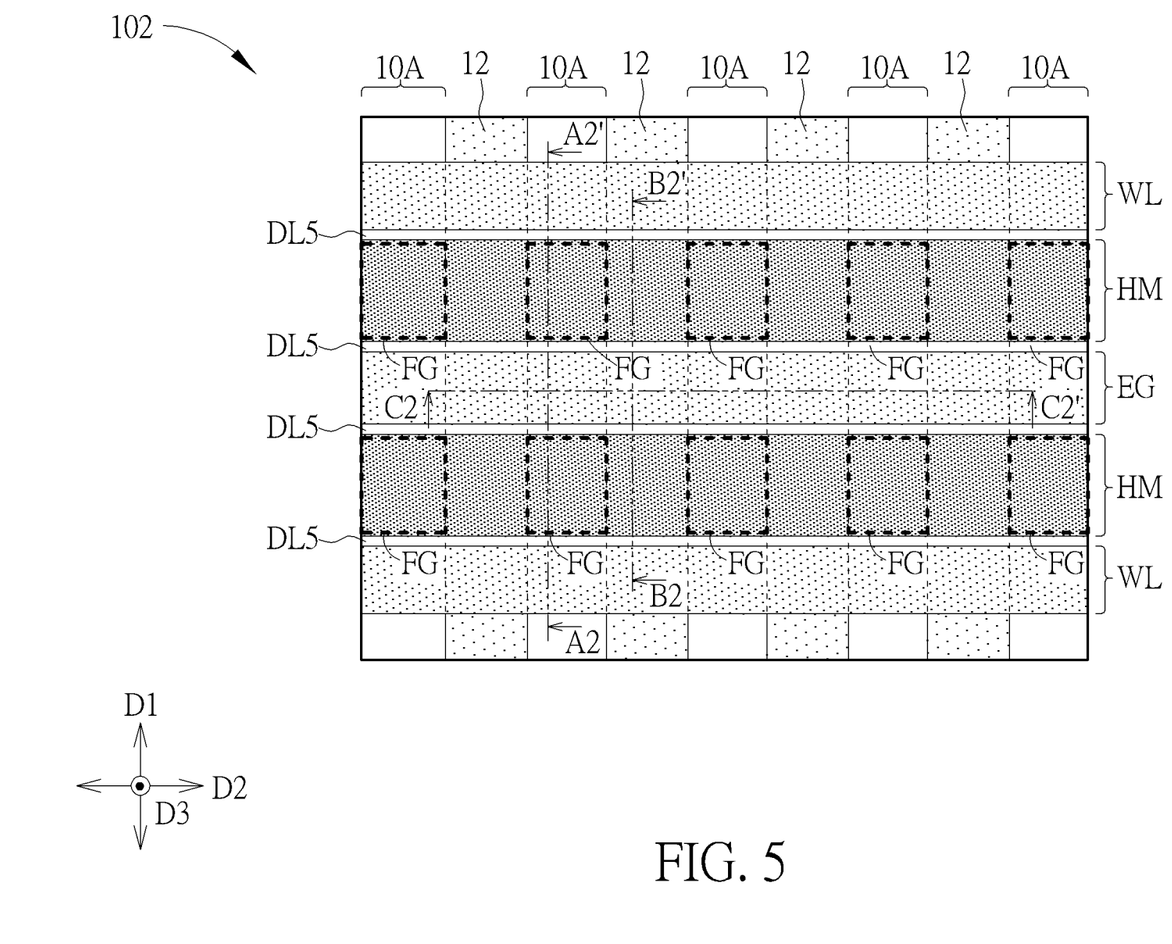
FIG. 5 is a schematic drawing illustrating a memory device according to a second embodiment of the present invention.
Figure 6:
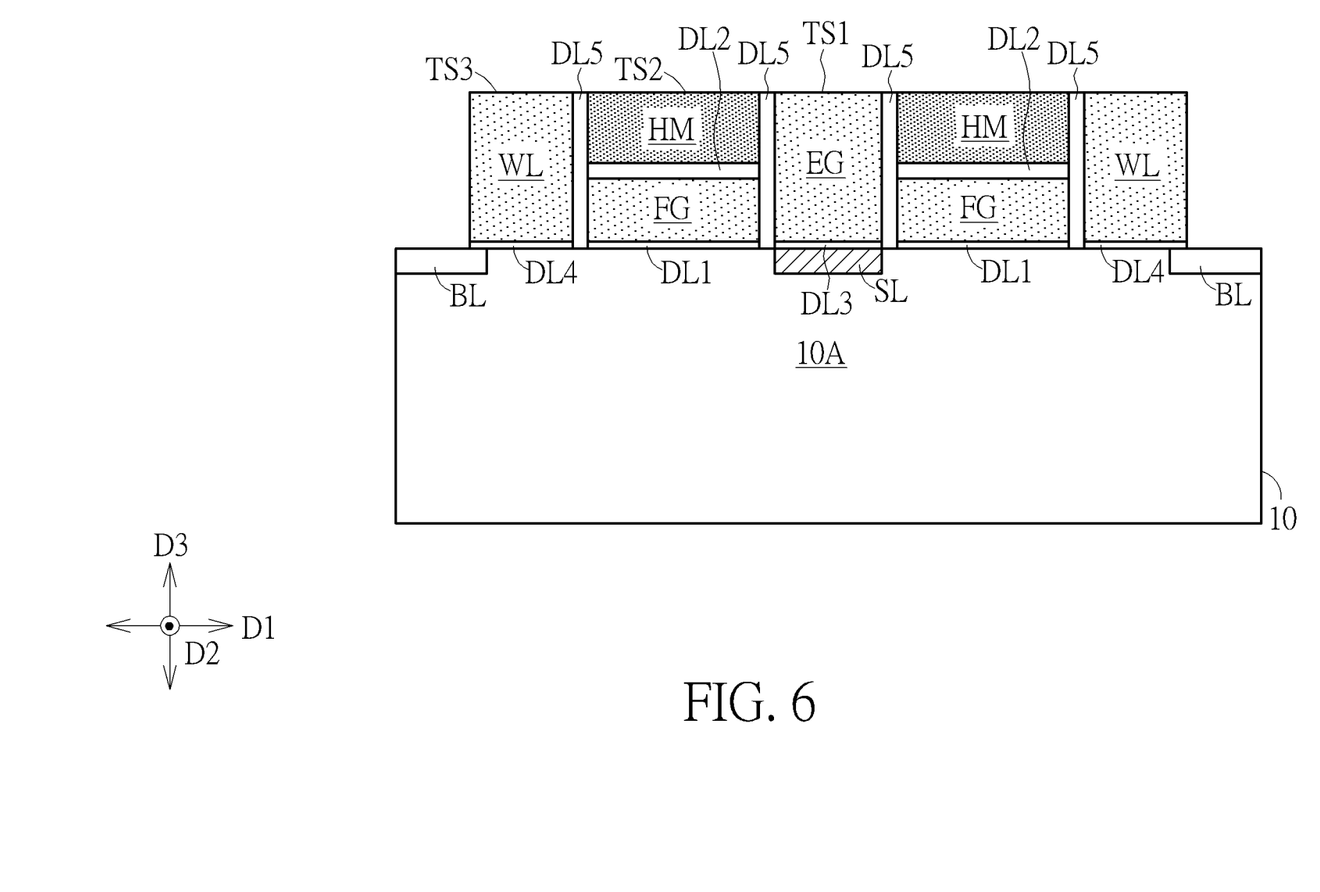
FIG. 6 is a cross-sectional diagram taken along a line A2-A2' in FIG. 5.
Figure 7:
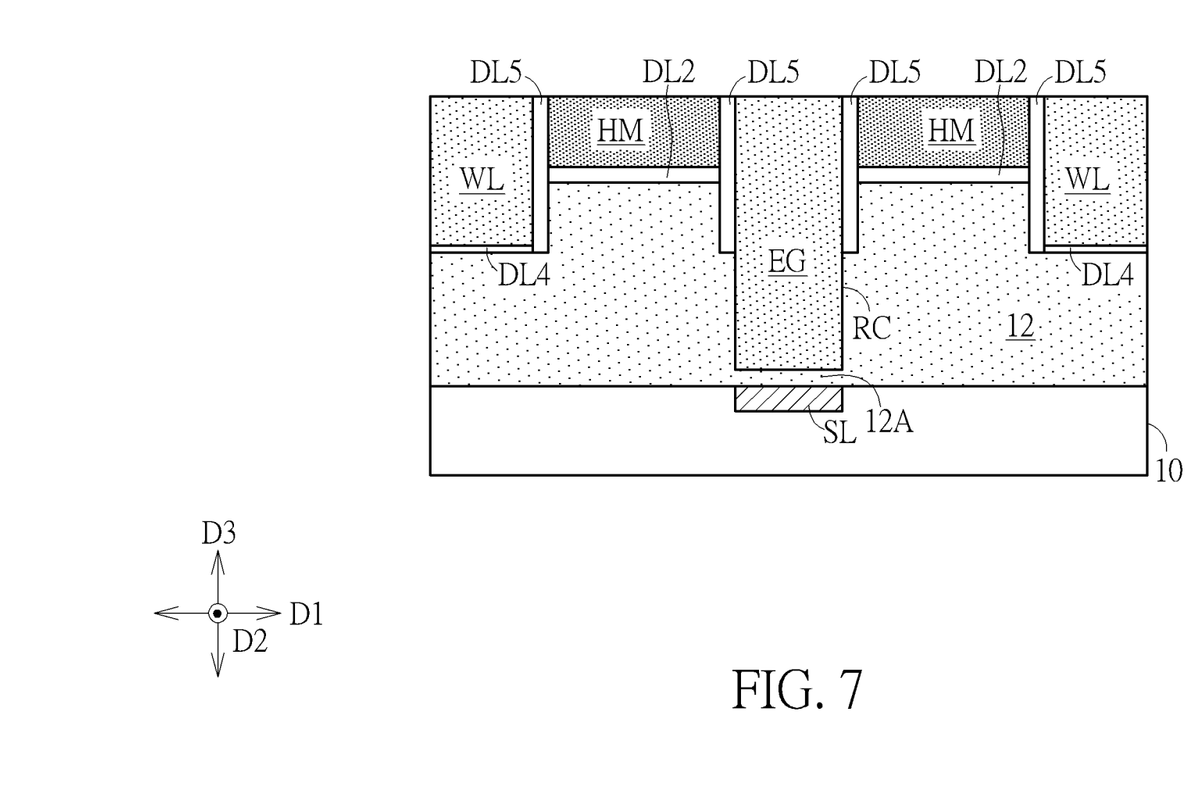
FIG. 7 is a cross-sectional diagram taken along a line B2-B2' in FIG. 5.
Figure 8:
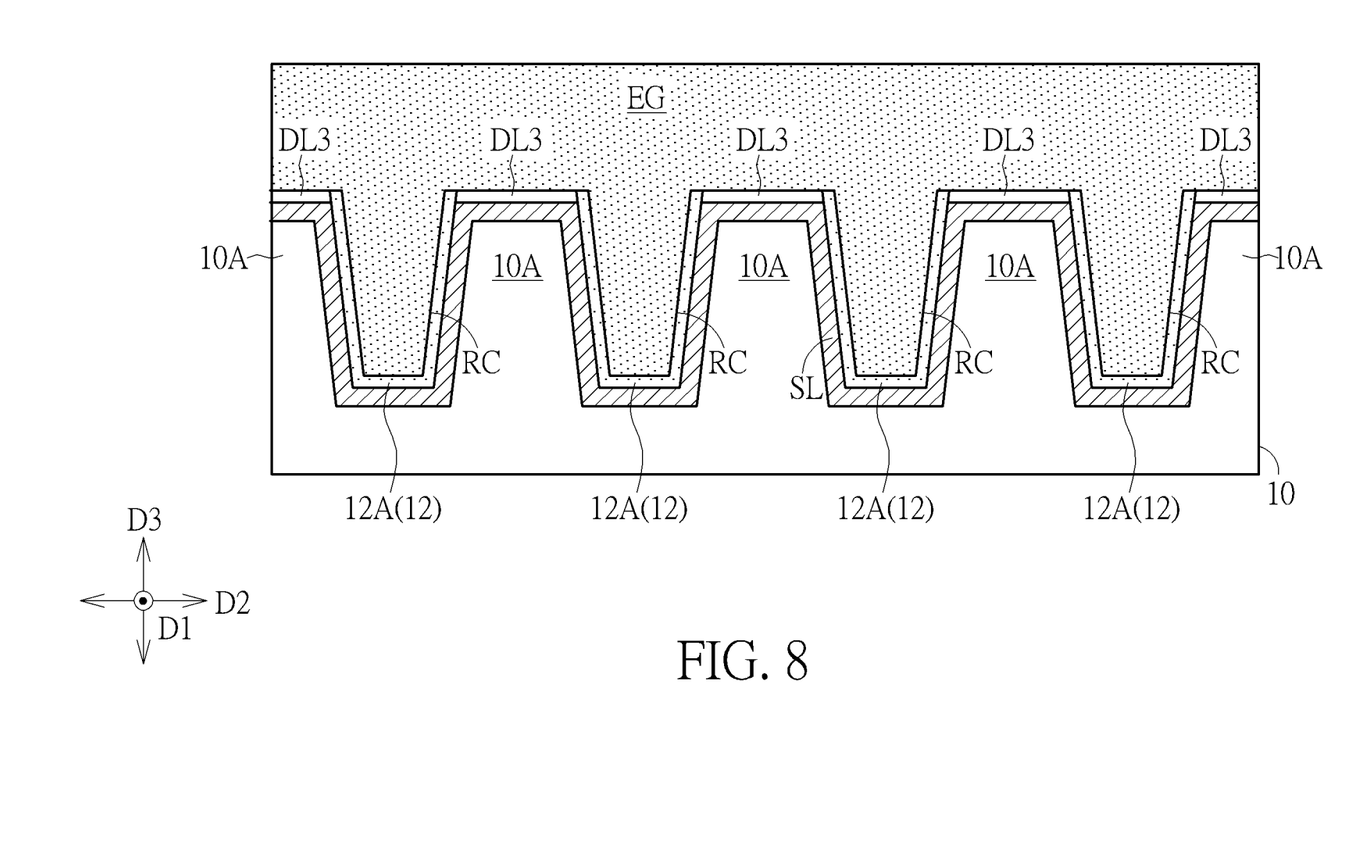
FIG. 8 is a cross-sectional diagram taken along a line C2-C2' in FIG. 5.

Please refer to FIGS. 5-8. FIG. 5 is a schematic drawing illustrating a memory device 102 according to a second embodiment of the present invention. FIG. 6 is a cross-sectional diagram taken along a line A2-A2' in FIG. 5, FIG. 7 is a cross-sectional diagram taken along a line B2-B2' in FIG. 5, and FIG. 8 is a cross-sectional diagram taken along a line C2-C2' in FIG. 5. As shown in FIGS. 5-8, the memory device 102 includes the semiconductor substrate 10, the isolation structures 12, the erase gate EG, the floating gates FG, a mask layer HM, and the dielectric layer DL2. The isolation structures 12 are disposed in the semiconductor substrate 10. The active regions 10A separated from one another are defined in the semiconductor substrate 10 by the isolation structures 12, and each of the active regions 10A is elongated in the direction D1. The erase gate EG is disposed on the semiconductor substrate 10 and elongated in the direction D2. The erase gate EG is disposed on the active regions 10A and the isolation structures 12, and the erase gate EG is partly disposed in the recess RC within each of the isolation structures 12. The floating gates FG are disposed on the semiconductor substrate 10, and the floating gates FG are arranged in the direction D2 and separated from one another. The mask layer HM is disposed on the floating gates FG and elongated in the direction D2. The dielectric layer DL2 is disposed between the mask layer HM and each of the floating gates FG in the direction D3, and the dielectric layer DL2 is directly connected with the mask layer HM.

In the memory device 102, the source line region SL may be disposed in the semiconductor substrate 10. The source line region SL may be disposed corresponding to the erase gate EG in the direction D3, and the source line region SL may be partly disposed under each of the isolation structures 12. The source dielectric layer (such as the dielectric layer DL3) may be disposed between the erase gate EG and the source line region SL, and the material composition of the isolation structures 12 may be different from the material composition of the dielectric layer DL3. Additionally, the recesses RC may be formed in the isolation structures 12, respectively. The thickness of a portion of each of the isolation structures 12 may be reduced by forming the recesses RC. Therefore, the too thick isolation structure 12 that blocks the implantation process configured for forming the source line region SL to implant dopants into the semiconductor substrate 10 and the situation where the desired source line region SL cannot be formed accordingly may be avoided. The source line region SL may be formed along the lower edge of each of the isolation structures 12 and the lower edge of the dielectric layer DL3 by forming the recesses RC in the isolation structures 12, and the source line regions SL located between the erase gate EG and each of the active regions 10A in the direction D3 may be connected with one another in series. By the design described above, it is not necessary to define an active region extending in the direction D2 by the process of forming the isolation structures 12 in the semiconductor substrate 10, and the related process issues and/or design constraints derived in this way can be avoided. The width of the erase gate EG (may be regarded as the length in the direction D1) may be reduced relatively, and the purposes of reducing the dimension of the memory cell and/or the area occupied by the memory device may be achieved accordingly.

The difference between the memory device 102 and the memory device in the first embodiment described above is that the memory device 102 may not include the control gate in the embodiment described above. In the memory device 102, the dielectric layer DL2 may be partly disposed between the mask layer HM and each of the floating gates FG in the direction D3 (as shown in FIG. 6) and partly disposed between the mask layer HM and each of the isolation structures 12 in the direction D3 (as shown in FIG. 7), and the dielectric layer DL2 may be directly connected with the mask layer HM, each of the floating gates FG, and each of the isolation structures 12. Additionally, the memory device 102 may include a dielectric layer DL5 disposed on a sidewall of the mask layer HM, a sidewall of the dielectric layer DL2, and a sidewall of the floating gate FG. A portion of the dielectric layer DL5 may be disposed between the mask layer HM and the erase gate EG in the direction D, disposed between the floating gate FG and the erase gate EG in the direction D1, and directly connected with the mask layer HM, the erase gate EG, and the floating gate FG. Another portion of the dielectric layer DL5 may be disposed between the mask layer HM and the word line structure WL in the direction D, disposed between the floating gate FG and the word line structure WL in the direction D1, and directly connected with the mask layer HM, the word line structure WL, and the floating gate FG. The dielectric layer DL5 may include an oxide dielectric material (such as silicon oxide) or other suitable dielectric materials.

As shown in FIGS. 5-8, in some embodiments, the mask layer HM, each of the floating gates FG, and a portion of each of the isolation structures 12 may be sandwiched between the erase gate EG and the word line structure WL in the direction D1, and a top surface TS3 of the word line structure WL, a top surface TS2 of the mask layer HM, and a top surface TS1 of the erase gate EF may be substantially coplanar, but not limited thereto. In some embodiments, one of the floating gates FG and other component located corresponding to this floating gate FG, such as the corresponding mask layer HM, the corresponding erase gate EG, the corresponding word line structure WL, the corresponding source line region SL, and the corresponding bit line region BL, may constitute a memory cell, but not limited thereto. In some embodiments, the memory device 102 may include two mask layers HM, two word line structures WL, and two bit line regions BL disposed at two opposite sides of the erase gate EG in the direction D1, respectively, the floating gates FG may be disposed at the two opposite sides of the erase gate EG in the direction D1, and the erase gate EG may be shared by two memory cells located adjacent to each other in the direction D1, but not limited thereto. By forming the recesses RC in the isolation structures 12, respectively, and disposing the erase gate EG partly in each of the recesses RC, the continuous source line region SL may be formed at the lower edge of each of the isolation structures 12 and the lower edge of the dielectric layer DL3 without forming the active region located under the erase gate EG and extending in the direction D2. Therefore, the width of the erase gate EG may be reduced relatively and the distance between the mask layers HM of the memory cells located adjacent to each other in the direction D1 may be reduced relatively, and the purpose of reducing the dimension of the memory cell and/or reducing the area occupied by the memory device may be achieved.

To summarize the above descriptions, in the memory device according to the present invention, the source line region may be formed along the lower edge of each of the isolation structures and the lower edge of the dielectric layer by forming the recesses in the isolation structures and disposing the erase gate partly in the recesses, and the source line regions located between the erase gate and each of the active regions in the vertical direction may be connected with one another in series accordingly. By the design described above, the width of the erase gate may be reduced relatively, and the purposes of reducing the dimension of the memory cell and/or reducing the area occupied by the memory device may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a semiconductor substrate;
   isolation structures disposed in the semiconductor substrate, wherein active regions separated from one another are defined in the semiconductor substrate by the isolation structures, and each of the active regions is elongated in a first direction;
   an erase gate disposed on the semiconductor substrate and elongated in a second direction, wherein the erase gate is disposed on the active regions and the isolation structures, and the erase gate is partly disposed in a recess within each of the isolation structures; and
   floating gates disposed on the semiconductor substrate, wherein the floating gates are arranged in the second direction and separated from one another, and each of the floating gates is partly disposed under the erase gate in a vertical direction.

2. The memory device according to claim 1, further comprising:
   a source line region disposed in the semiconductor substrate, wherein the source line region is disposed corresponding to the erase gate in the vertical direction, and the source line region is partly disposed under each of the isolation structures.

3. The memory device according to claim 2, further comprising:
   a source dielectric layer disposed between the erase gate and the source line region, wherein a material composition of the isolation structures is different from a material composition of the source dielectric layer.

4. The memory device according to claim 1, further comprising:
   a control gate disposed on the floating gates and elongated in the second direction; and
   a first dielectric stack disposed between the erase gate and the control gate in the first direction.

5. The memory device according to claim 4, wherein the first dielectric stack is disposed above the floating gates in the vertical direction.

6. The memory device according to claim 4, wherein the first dielectric stack comprises an oxide-nitride-oxide (ONO) dielectric stack.

7. The memory device according to claim 4, further comprising:
   a mask layer disposed on the control gate and elongated in the second direction; and
   a dielectric layer disposed between the mask layer and the control gate in the vertical direction.

8. The memory device according to claim 4, further comprising:
   a second dielectric stack, wherein the second dielectric stack is partly disposed between the control gate and each of the floating gates in the vertical direction and partly disposed between the control gate and each of the isolation structures in the vertical direction, and the second dielectric stack is directly connected with the control gate and the isolation structures.

9. The memory device according to claim 8, wherein the second dielectric stack comprises an oxide-nitride-oxide dielectric stack.

10. The memory device according to claim 1, wherein the erase gate comprises:
    a first portion; and
    a second portion disposed above the first portion in the vertical direction, wherein each of the floating gates is partly disposed under the second portion of the erase gate in the vertical direction, and a width of the second portion is greater than a width of the first portion.

11. The memory device according to claim 1, further comprising:
    a word line structure disposed on the semiconductor substrate and elongated in the second direction, wherein a portion of each of the isolation structures is sandwiched between the erase gate and the word line structure in the first direction.

12. A memory device, comprising:
    a semiconductor substrate;
    isolation structures disposed in the semiconductor substrate, wherein active regions separated from one another are defined in the semiconductor substrate by the isolation structures, and each of the active regions is elongated in a first direction;

an erase gate disposed on the semiconductor substrate and elongated in a second direction, wherein the erase gate is disposed on the active regions and the isolation structures, and the erase gate is partly disposed in a recess within each of the isolation structures;

floating gates disposed on the semiconductor substrate, wherein the floating gates are arranged in the second direction and separated from one another;

a mask layer disposed on the floating gates and elongated in the second direction; and a dielectric layer disposed between the mask layer and each of the floating gates in a vertical direction, wherein the dielectric layer is directly connected with the mask layer.

13. The memory device according to claim 12, further comprising:

a source line region disposed in the semiconductor substrate, wherein the source line region is disposed corresponding to the erase gate in the vertical direction, and the source line region is partly disposed under each of the isolation structures.

14. The memory device according to claim 13, further comprising:

a source dielectric layer disposed between the erase gate and the source line region, wherein a material composition of the isolation structures is different from a material composition of the source dielectric layer.

15. The memory device according to claim 12, wherein the dielectric layer is directly connected with each of the floating gates.

16. The memory device according to claim 12, wherein the dielectric layer is further disposed between the mask layer and each of the isolation structures in the vertical direction, and the dielectric layer is directly connected with the isolation structures.

17. The memory device according to claim 12, further comprising:

a word line structure disposed on the semiconductor substrate and elongated in the second direction, wherein the mask layer is sandwiched between the erase gate and the word line structure in the first direction.

18. The memory device according to claim 17, wherein a top surface of the word line structure, a top surface of the mask layer, and a top surface of the erase gate are coplanar.

19. The memory device according to claim 17, wherein a portion of each of the isolation structures is sandwiched between the erase gate and the word line structure in the first direction.

20. The memory device according to claim 12, wherein the mask layer comprises silicon nitride.

* * * * *